United States Patent [19]

Arras

[11] Patent Number: 4,772,979
[45] Date of Patent: Sep. 20, 1988

[54] VOLTAGE SHOCK PROTECTION CIRCUIT

[75] Inventor: Juho Arras, Stockholm, Sweden

[73] Assignee: Telefonaktiebolaget L M Ericsson, Stockholom, Sweden

[21] Appl. No.: 108,631

[22] Filed: Oct. 15, 1987

[30] Foreign Application Priority Data

Oct. 28, 1986 [SE] Sweden .............................. 8604591-1

[51] Int. Cl.[4] .......................... H02H 3/20; H02H 3/24
[52] U.S. Cl. ........................................ 361/90; 361/91; 361/92; 361/101
[58] Field of Search ........................ 361/58, 86, 88, 90, 361/91, 92, 100, 101, 110, 111; 307/200 A, 200 B, 576, 568; 340/662, 663

[56] References Cited

U.S. PATENT DOCUMENTS

| 3,603,811 | 9/1971 | Day | 361/88 X |
| 3,656,025 | 4/1972 | Roueti | 361/58 |
| 3,986,060 | 10/1976 | Nishizawa et al. | 361/58 X |
| 4,686,383 | 8/1987 | Croft | 361/91 X |

FOREIGN PATENT DOCUMENTS

| 0115002 | 8/1984 | European Pat. Off. . |
| 0133789 | 3/1985 | European Pat. Off. . |
| 3445340 | 6/1986 | Fed. Rep. of Germany . |

Primary Examiner—J. R. Scott
Assistant Examiner—Derek S. Jennings
Attorney, Agent, or Firm—Burns, Doane, Swecker & Mathis

[57] ABSTRACT

A voltage shock protection circuit having two anti series connected field effect transistors adapted for being connected between a conductor and a protected circuit for connecting the protected circuit to the conductor and also protecting the protected circuit against voltage transients possibly occurring in the conductor, the voltage transients having excessively high or low potentials that could damage the protected circuit. The voltage shock protection circuit has a voltage sensing circuit connected to the protected circuit and to the conductor so that it is sensitive to voltage drops across each of the anti series connected field effect transistors and adapted such that when either of the voltage drops becomes sufficiently great one of the field effect transistors is pinched off. The voltage sensing circuit may include a field effect transistor. The two anti series connected field effect transistors and/or the field effect transistor in the voltage sensing circuit are dimensioned such that in their conductive state they become saturated on the occurrence of a voltage transient with a damaging potential.

23 Claims, 3 Drawing Sheets

VOLTAGE SHOCK PROTECTION CIRCUIT

TECHNICAL FIELD

The present invention relates to a voltage shock protection circuit adapted for connection between a conductor and a circuit, partly for connecting the circuit to the conductor and partly for protecting the circuit against voltage transients possibly occuring on the conductor and having exessively high or low potential which could cause damage to the circuit. Protective circuits in accordance with the invention are particularly but not exclusively intended for line circuits in subscriber stages which are to be protected against voltage transients caused by lightning etc on a subscriber line.

BACKGROUND ART

It has been known for a long time to use devices for protecting telephone exchanges against overvoltages caused by such as lightning on subscriber lines. Many different kinds of protective devices have been proposed for this purpose.

It is known to use two anti series connected field effect transistors as switches, inter alia in circuits for connecting a line circuit in a telephone station to a subscriber line. To protect such switches against excessive loss effects due to voltage transients which can occur on the subscriber line, it is known to supplement the circuit with electronic shut off means for the switches.

Such a shut off means described in EP No. 0133789 includes a drive voltage means and electronic switches intended for supplying the anti series connected field effect transistors with a common drive voltage between their source electrodes and gate electrodes such that current can flow in both directions between the line and the protected circuit as well as being intended to supply a common drive voltage between the source electrodes and gate electrodes such that the current cannot flow in any direction between the conductor and circuit via both the anti series connected field effect transistors. The means described in EP No. 0133789 also includes voltage sensing means connected to the conductor and the protected circuit so that it is sensitive to the voltage drops across the transistors. The voltage sensing means is adapted, when the voltage over either of the transistors in a conductive state exceeds a given magnitude, to actuate the switches so that the drive voltage will be such that one of the field transistors is shut off. MOS field effect transistors are used as switches and voltage sensing means in circuits described in EP No. 0133789.

In each of U.S. Pat. No. 3,369,129 and U.S. Pat. No. 3,656,025 it is taught that for limiting the current in a circuit, e.g. for medicinal purposes, two series connected field effect transistors of the JFET type are connected into the circuit, and by coming into a saturated conductive state these transistors can limit the current in the circuit.

DISCLOSURE OF INVENTION

Correctly dimensioned and connected, a switch in the form of two anti series connected field effect transistors in combination with a sufficiently rapid and reliable shut off means can be used as a circuit for protecting a protected circuit such as a line circuit in a telephone exchange, against excessive voltage transients occurring on a line, these translents having been caused by such a lightning on the line.

In such protective circuits including two anti series connected field effect transistors between a conductor and a circuit there is the problem of obtaining sufficiently reliable, rapid and complete shut off of one of the transistors for protecting the protected circuit against rapid voltage transients, which could cause damage of the protected circuit, particularly when the object is to avoid too great demands on performance with respect to the components included in the protective circuits. Since the intention is to manufacture protective circuits in the form of integrated circuits, there may be special problems occuring in certain circuit solutions due to the anti series connected field effect transistors and further field effect transistors included in the circuit nominally having the same threshold voltage since they are fabricated in the same process.

One object of the present invention is to solve the above-mentioned problems and to achieve a protective circuit with reliable, rapid and sufficient shut off of the reverse series connected field effect transistors.

A second object of the invention is to provide a protective circuit of the kind in question which is suitable for fabrication as an integrated circuit.

Summarily expressed and severely simplified, the function of a protective circuit in accordance with the invention could be described as being such that the shut off of one of the field effect transistors is triggered by an excessive voltage drop across one of the reverse series connected field effect transistors.

Summarily expressed and severely simplified, it could be said that what is distinguishing for a protective circuit in accordance with the invention in such a case is that one, two or more of the field effect transistors included in the protective circuit shall be dimensioned such that in a conductive state it/they will reach a saturated state for the occurence of a voltage transient of the kind in question.

In a preferred embodiment of a protective circuit in accordance with the invention, it is the two anti series connected field effect transistors which are dimensioned to enable coming into a saturated state on the occurence of a voltage transient with a potential such as could cause damage to the protected circuit. Accordingly, a voltage sensing means connected such that it is sensitive to the voltage drops across the reverse series connected field effect transistors can more simply and rapidly detect the occurence of the voltage transient. A more reliable and rapid shutting off of the field effect transistors can then be obtained via the voltage sensing means.

In a second preferred embodiment of a protective circuit in accordance with the invention, there is a third field effect transistor which is connected such that it is sensitive to the voltage drop across the anti series connected field effect transistors and is adapted such as to actuate a switch, said third transistor being dimensioned to come into its saturated state on the occurence of a voltage transient of the kind in question. Accordingly, a thyristor may be used as the switch, this thyristor being connected to the source and gate electrodes on the third and the anti series connected field effect transistors, while the source electrode of the extra field effect transistor can be connected to the gate electrode of the thyristor without risk of damaging the thyristor. By automatically coming into its saturated state on the occurence of a voltage transient of the kind in question, the third field effect transistor can namely limit the possible current through the thyristor gate electrode to a magnitude which will not damage the thyristor. The combination of a third field effect transistor and thyristor connected in this way creates the conditions for rapid and reliable shutting off of the anti series connected field effect transistors.

In a third preferred embodiment of a protective circuit in accordance with the invention both the anti series connected field effect transistors as well as a third field effect transistor according to the above are dimensioned for coming into their saturated states in conjunction with the occurence of a voltage transient having a potential which could damage the protected circuit.

Further advantages with different embodiments of protective circuits in accordance with the invention will be understood by one skilled in the art after studying the following description of the respective embodiment.

What is more completely and correctly expressed as distinguishing for different embodiments of a protective circuit in accordance with the invention is disclosed in the claims.

BEST MODES FOR CARRYING OUT THE INVENTION

Figure 1:
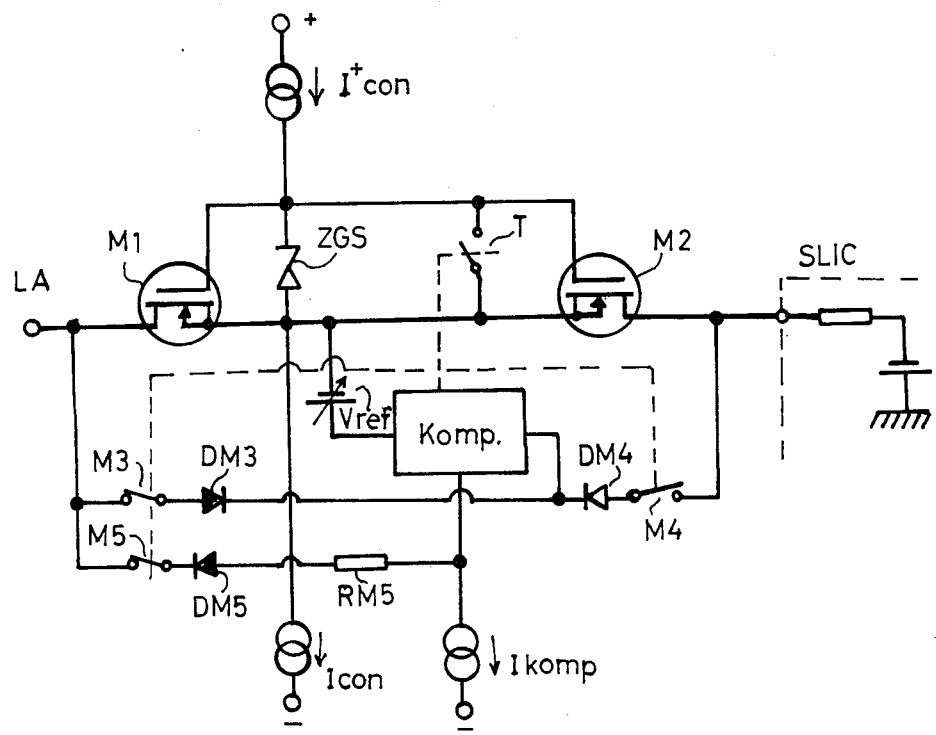
FIG. 1 illustrates, greatly simplified, a circuit diagram of a first embodiment of a voltage shock protection circuit connected between a conductor and a protected circuit.

In FIG. 1 a voltage shock protection circuit is connected between a conductor LA and a circuit SLIC. The circuit has the task of connecting the circuit SLIC to the conductor LA and protecting the circuit SLIC against voltage transients possibly occurring on the conductor and having potentials that are so high or so low that they could cause damage to the circuit SLIC. This circuit SLIC can be a line circuit in a subscriber stage in a telephone exchange, and the conductor can be a subscriber line.

The circuit according the FIG. 1 includes two anti series connected field effect transistors M1 and M2 with their source electrodes S mutually connected and their gate electrodes G mutually connected. A first of the transistors, M1, has its drain electrode D directly connected to the conductor LA. A second, of the transistors, M2, has its drain electrode D directly connected to the circuit SLIC. In addition, both transistors M1 and M2 have their substrate connected to the source electrode of the respective transistor.

For turning both transistors M1 and M2 on or off, the circuit in FIG. 1 includes a drive voltage means controllable by an electronic switch T. The drive voltage means includes two current generator means I+con and I−con and a zener diode $Z_{GS}$. A first of the current generator means, I+con is connected between a positive supply voltage, +, and the gate electrodes G of both anti series connected field effect transistors, to which gate electrodes one pole of the zener diode is also connected. The other pole of the zener diode is connected to the source electrodes of both anti series connected field effect transistors and to the second current generator means I−con, which is further connected to a negative supply voltage, −. The electronic switch T is connected in parallel with the zener diode between the source electrodes S and gate electrodes G of both transistors M1 and M2.

The first current generator means is adapted to supply a current to the pole of the Zener diode $Z_{GS}$ connected to the gate electrodes G. The second current generator means is adapted to lead off a current from the pole of the Zener diode connected to the source electrodes. This supplied and led off current is intended to pass through the Zener diode when the switch T is open for providing a common drive voltage for both transistors M1 and M2. The drive voltage across the Zener diode will then be such that the transistors M1 and M2 become conductive, whereby current can flow in both directions between the conductor LA and the circuit SLIC via the anti series connected transistors. When, instead, the switch T is closed, the Zener diode is shortcircuited, thus passing no current, and no drive voltage making M1 and M2 conductive is achieved across the zener diode. In this case, current can not flow in any direction between the conductor LA and circuit SLIC via both transistors M1 and M2.

The circuit in FIG. 1 includes a voltage sensing means in the form of a comparator komp coupled via a diode DM3 and a switch M3 to the conductor LA and via a diode DM4 and a switch M4 to the circuit SLIC. In addition, the comparator is connected to the source electrodes of the transistors M1 and M2 via a reference voltage means with adjustable reference voltage $V_{REF}$.

The comparator is further connected to negative supply voltage, −, via a third current generator means, $I_{komp}$, and to the conductor LA via a series circuit comprising a resistor RM5, a diode DM5 and a switch M5. The comparator is adapted to compare the voltage from the diodes DM3 and DM4 with the voltage from the reference voltage means $V_{REF}$, and when the voltage from the diodes is sufficiently great compared with the voltage from $V_{REF}$, to close the switch T and subsequently open the switches M3, M4 and M5. Due to the diodes DM3 and DM4 being in reverse pole relationship, the voltage supplied from the diodes to the comparator at the common connection point will be responsive to the highest of the potentials at the connections of the conductor LA and circuit SLIC to the voltage shock protection circuit. Accordingly, the comparator will be sensitive to either of the voltage drops across the two anti series connected field effect transistors.

The circuit of FIG. 1 is intended to function in the following manner. In normal operation, before any voltage transient damaging to the circuit SLIC has occured on the conductor LA, and the potential of the conductor is within a range which will do no damage, the switch T is open and the switches M3, M4 and M5 are closed. The current means I+con and I−con drive a current through the Zener diode $Z_{GS}$, whereby a drive voltage to the transistors M1 and M2 is generated such that they are turned on. If the potential on the conductor LA at its connection to the protective circuit is substantially greater than the potential at the connection of the circuit SLIC to the protective circuit, then the diode DM3 is conducting while the diode DM4 is blocking. The comparator is then sensitive to the voltage drop across M1 but does not close the switch T, due to this voltage drop not being sufficiently great in normal operation. If instead, the potential on the conductor LA at its connection to the protective circuit is substantially lower than the potential at the connection of the circuit SLIC to the protective circuit, then the diode DM4 is conducting while DM3 is blocking. In this case the comparator will be sensitive to the voltage drop across M2, but it does not close the switch T, due to this voltage drop not being sufficiently great in normal operation.

If the potential at the connection of the conductor LA to the protective circuit is greater than at the connection of the circuit SLIC to the protective circuit and is rising, the voltage drop across the transistors M1 and M2 increases. In time with an increasing voltage drop across M1 the potential supplied to the comparator from the diode DM3 then increases in relation to the potential supplied from $V_{REF}$. When the potential from DM3 becomes sufficiently high in relation to the potential from $V_{REF}$, the comparator first closes the switch T and then opens the switches M3, M4 and M5. When the switch T is closed, the drive voltages to M1 and M2 are reduced. In this way M1 can be caused to block current from the conductor LA to the circuit SLIC. On the other hand, M2 can still lead current towards SLIC via its substrate diode.

If the potential at the connection of the conductor LA to the protective circuit is lower than at the connection of the circuit SLIC to the protective circuit and is falling, then the voltage drop across the transistors M1 and M2 increases. In time with an increasing voltage drop across M2 the potential supplied to the comparator from $V_{REF}$ then falls in relation to the potential supplied from the diode DM4. When the potential from $V_{REF}$ is sufficiently low in relation to the potential from DM4, the comparator first closes the switch T and then opens the switches M3, M4 and M5. When the switch T is closed, the drive voltages to M1 and M2 are reduced. In this way M2 can be caused to block current from the circuit SLIC to the conductor LA. On the other hand M2 can still lead current towards LA via its substrate diode.

In both the cases mentioned above, a state in the protective circuit is obtained whereby the conductor LA becomes substantially isolated from the circuit SLIC.

IThe potentials on the conductor LA for which the comparator closes the switch T1 are responsive to the characteristic of the anti series connected field effect transistors, the forward voltage drops across DM3 and DM4 as well as the reference voltage $V_{REF}$. By altering $V_{REF}$, for example, the comparator can be caused to close the switch T at different potentials on the conductor LA. Preferably, the switch T has a "self-holding" function, or the comparator has a hysterisis function which causes the switch T, after it has been closed, not to open once again shortly afterwards, if the potential at the connection to the conductor LA returns to a value within the range at which no damage occurs.

To obtain rapid and reliable reaction in the comparator, the anti series connected field effect transistors are dimensioned, in accordance with the invention, such that in a conductive state they will reach saturation when a voltage transient with damaging potential occurs in the conductor. Furthermore, the comparator is adapted in accordance with the invention to actuate the switch when the voltage across either of transistors M1 and M2 is so large that the respective transistor is saturated. That the comparator reaction will be more rapid and more reliable in conjunction with the respective transistor coming into its saturated state is tied up with the voltage drop across the transistor increasing more rapidly with the current through the transistor when it is in its saturated state.

For practical reasons, it is desirable that a voltage shock protection circuit shall be able to function well with moderate supply voltages also. In a circuit according to FIG. 1, there is the risk with moderate negative supply voltage that the source electrodes of the transistors, as well as the inputs from $V_{REF}$ and DM4 of the comparator will arrive at a lower potential than the negative supply voltage before the comparator has had time to first close switch T and then open the switches M3, M4 and M5. If this happens, current supply via the current generator means $I_{komp}$ to the comparator komp will cease. To avoid malfunction in conjunction with moderate negative supply voltages, the protective circuit according to FIG. 1 includes a circuit from the comparator via the resistor RM5, diode DM5 and switch M5 to the conductor LA, and this circuit can take over the functions of the current generator means $I_{komp}$ when LA is suddenly given a substantially lower potential than the negative supply voltage.

Figure 2:
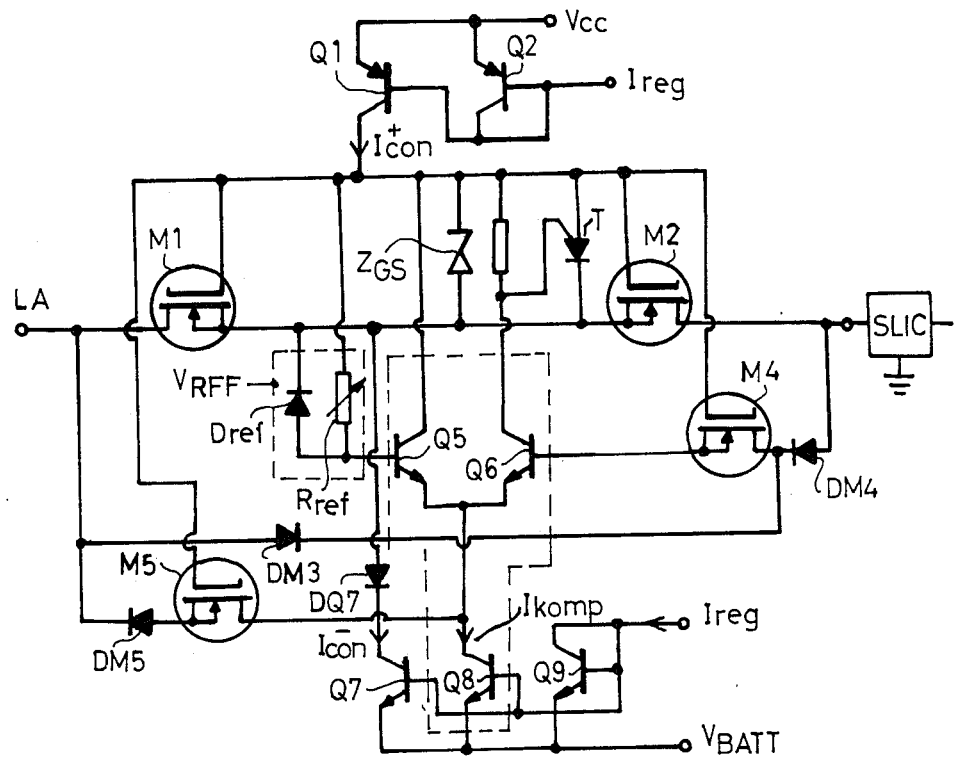
FIG. 2 illustrates a second embodiment of a voltage shock protection circuit connected between a conductor and a protected circuit.

The voltage shock protection circuit illustrated in FIG. 2 differs from the one in FIG. 1 mainly by its being illustrated somewhat more detailed. In addition, it has the two field effect transistors M4 and M5 connected for control via the drive voltage instead of the three switches M3, M4 and M5 in FIG. 1 controlled directly by the comparator. The function of the circuit illustrated in FIG. 2 is, however, essentially the same as that of the circuit in FIG. 1.

In FIG. 2, three npn transistors Q5, Q6 and Q8 have the same function as constitute the comparator komp and the current generator device $I_{komp}$ in FIG. 1. A diode $D_{REF}$ connected in series with a variable resistor $R_{REF}$ between the source and gate electrodes of the anti series connected field effect transistors functions as reference voltage means. Two transistors Q1 and Q2 function as a first current generator means for supplying current to one pole of the Zener diode. Two transistors Q7, Q9 and a diode DQ7 function as a second current generator device for taking away a substantially equal current from the other pole of the Zener diode. A fourth field effect transistor M4 with its source electrode connected to the base of the transistor Q6 and its drain electrode D connected to the cathodes of the diodes DM3 and DM4 also has its gate electrode G connected to the gate electrodes of the transistors M1 and M2 and functions as a switch. A fifth field effect transistor M5 has its source electrode connected to the anode of the diode DM5 and has its drain electrode connected to Q5, Q6 and Q8 and has its gate electrode connected to the gate electrodes of M1 and M2. This fifth transistor M5 functions as a combined switch and resistor. Q5, Q6 and Q8 function approximately as a differential amplifier and control the thyristor T by the collector of Q6 being connected to the gate electrode of the thyristor T, which thyristor is implemented such that its control takes place via the n base.

The current supplied or led away by respectively the first or the second current generator means is greater than the thyristor holding current. When the thyristor has been turned on by Q6, it will subsequently continue to conduct irrespective of Q6 as long as it gets sufficient current via the current generator means. The thyristor thus functions in this implementation of the protective as a "self-holding" electronic switch.

Figure 3:
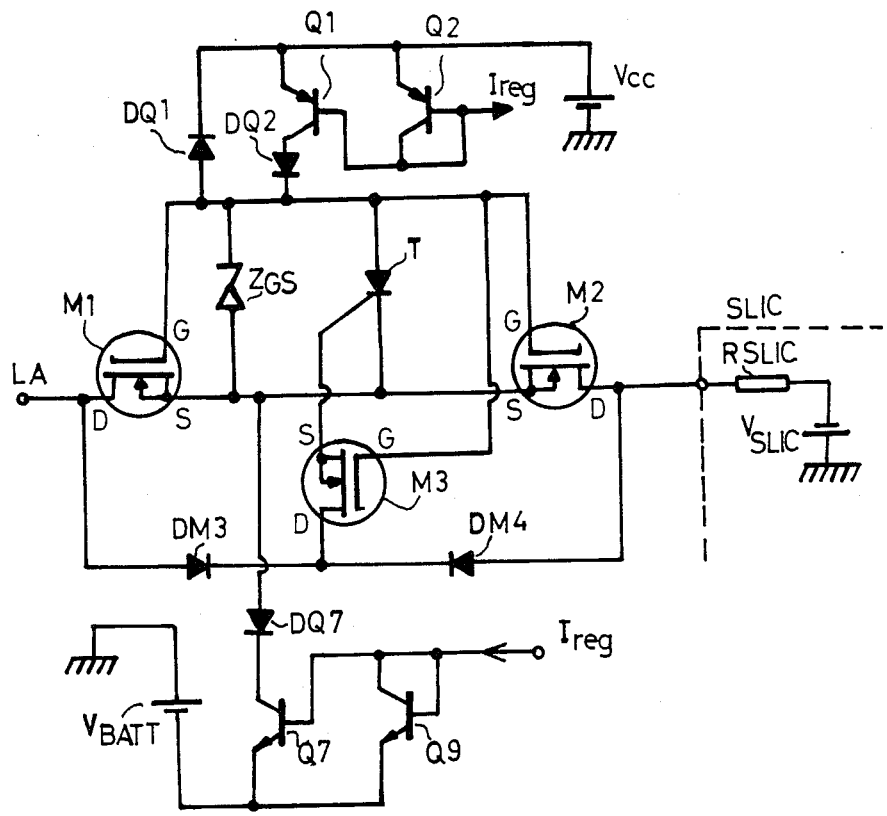
FIG. 3 illustrates a third embodiment of a voltage shock protection circuit connected between a conductor and a protected circuit.

The voltage shock protection circuit according to FIG. 3 differs from the protective circuits according to FIGS. 1 and 2 primarily by its having a voltage sensing means in the form of a third field effect transistor M3 connected via diodes DM3 and DM4 respectively to the connection of the conductor LA and of circuit SLIC to the voltage shock protection circuit. The third field effect transistor M3 has its gate electrode G connected to the gate electrodes of the transistors M1 and M2 and its source S electrode connected to the gate electrode of the thyristor T. In this embodiment of the protective circuit, the gate electrode of the thyristor is connected to the p base of the thyristor. In FIG. 3, Q1, Q2, DQ1 and DQ2 constitute a first current generator device of similar kind and with similar tasks as the first current generator means in FIG. 2 or the current generator means I+con in FIG. 1. In addition, Q7, Q9 and DQ7 constitute a second current generator means of a similar kind and with similar tasks as the second current generator means in FIG. 2 or the current generator means I−con in FIG. 1. The diodes DQ1 and DQ2, with which the first current generator transistors Q1, Q2 are connected to the Zener diode etc has the task of preventing problems when transistor Q1 is reverse biased. This occurs with sufficiently excessive positive voltages in LA. The diode DQ7, with which the second current generator transistors Q7, Q9 are connected to the Zener diode etc has the task of protecting Q7 for sufficiently excessive negative voltage on LA.

The third field effect transistor M3 in FIG. 3 is sensitive to either of the voltage drops across the reverse series connected field effect transistors M1 and M2 and is adapted to be conducting for turning on the thyristor T when the respective voltage drop is sufficiently great in relation to the forward voltage drop across the thyristor T and either the diode DM3 or diode DM4. The current supplied by the first current generator device or taken away by the second current generator device is greater than the thyristor holding current. When the thyristor is turned on by M3, it will subsequently continue to conduct irrespective of M3 as long as it obtains sufficient current via the current generator device. In this embodiment of the protective circuit the thyristor thus functions as a "self-holding" electronic switch.

When the voltage shock protection circuit in FIG. 3 reacts to a voltage transient of sufficiently excessive high or low potential in the conductor LA by short circuiting the drive voltage across the Zener diode with the aid of the thyristor, one of M1 and M2 will be pinched off to a nonconductive state while the other will be conducting via its substrate diode. Since the gate electrode G of M3 is also connected to the Zener diode, M3 will also be pinched off into a nonconductive state when the thyristor has become conductive and has short circuited the drive voltage to the transistors M1 and M2. During the time when M3 is becoming conductive and is controlling the thyristor and before the drive voltage has had time to taper off sufficiently for M3 to become nonconductive there will be a current path either from the conductor LA via DM3, M3, thyristor gate electrode and substrate diode of M2 to the circuit SLIC or from the circuit SLIC via DM4, M3, the thyristor gate electrode and substrate diode of M1 to the conductor LA. It is desirable that the thyristor is turned on as rapidly and as reliably as possible, but the thyristor control input must be simultaneously protected against excessive currents due to its limited ability to withstand current. In order to use a suitable thyristor and turn it on rapidly and reliably, the third field effect transistor M3 is therefore dimensioned, by coming into its saturated state, automatically to limit the current through the thyristor gate electrode to a magnitude which will not damage the thyristor. Due to this current limitation of the third field effect transistor M3, the latter and the thyristor can be used respectively as voltage sensing device and switch in the circuit without further components, apart from the diodes, needing to be connected in series with them, which further components could make the voltage shock protection less rapid or reliable. The current limitation of the third field effect transistor during the above-mentioned time can also protect the circuit SLIC against excessive currents via the thyristor during this time.

In the protective circuit according to FIG. 3, it is to be preferred that the reverse series connected field effect transistors M1 and M2 also are dimensioned for coming into their saturated state on the occurence of a voltage transient in the conductor LA having a potential which could cause damage to the circuit SLIC. However, it is not absolutely necessary in all operational cases and applications that M1 and M2 are dimensioned in this way, and in individual cases it could be sufficient for M3 by itself to be dimensioned for coming into its saturated state.

Exactly how M1, M2 and M3 are to be dimensioned naturally varies from case to case, depending on what voltage the circuit SLIC is to withstand, which thyristor is used etc. In addition, since it is known to one skilled in the art how different dimensioning of a field effect transistor affects its electrical parameters, it should not be necessary here to describe any dimensioning case. For one skilled in the art it can, however, be mentioned that the field effect transistors in FIGS. 1–3 may be of the DMOS type with an n channel, and have a typical threshold voltage $V_{TO}=2V$. In such a case, the drive voltage for M1 and M2 can be about 5:2V, which, together with suitably selected geometrical dimensions can give M1 and M2 a conduction resistance in the linear range of about 7:5 ohms. The current limitation by saturation can then occur for a current of about 230mA through M1/M2. The voltage shock protection circuit can be fabricated using a known process for integrated circuits, which gives dielectric insulation between the components.

A voltage shock protection circuit according to FIGS. 1–3 can be modified in many ways within the scope of the invention. For example somewhat different current generator means may be used. Although it is preferred to have the drain electrode of the first field effect transistor directly connected to the conductor and to have the drain electrode of the second field effect transistor directly connected to the protected circuit it might in some case be possible to have the drain electrodes connected to the conductor and protected circuit via intermediate components. In such a case it might also be possible in some cases to have the anodes of the diodes DM3 and DM4 connected either directly to the drain electrodes of the first and second transistors or conductor and protected circuit or via intermediate components. This is however not preferred. Other modifications may be conceivable to those skilled in the art.

I claim:

1. A voltage shock protection circuit adapted for connection between a conductor and a protected circuit for connecting the protected circuit to the conductor and protecting it against voltage transients of excessively high or low potential possibly occurring in the conductor, where these could cause damage to the protected circuit, this voltage shock protection circuit including two anti series connected field effect transistors and a drive voltage means controllable by an electronic switch, said anti series connected field effect transistors having their source electrodes connected to each other and their gate electrodes connected to each other and their substrates connected to the source electrode of the respective anti series connected field effect transistor, said drive voltage means being controllable to a first operational state in which said drive voltage means strives to maintain a common drive voltage between the gate electrodes and source electrodes of the two anti series connected field effect transistors such that current can flow in both directions between the conductor and the protected circuit via the two anti series connected field effect transistors, as well as to a second operational state in which the drive voltage means strives to maintain a common drive voltage between the gate electrodes and source electrodes of the two anti series connected field effect transistors such that current cannot flow in any direction between the conductor and the protected circuit via both anti series connected field effect transistors, said voltage shock protection circuit including a voltage sensing means connected to the conductor and the protected circuit such that it is sensitive to the voltage drops across the two anti series connected field effect transistors and adapted such that when the voltage drop across either of the anti series connected field effect transistors exceeds a given magnitude it actuates the electronic switch for controlling the drive voltage means into the second operational state, characterized in that the two anti series connected field effect transistors are dimensioned such that in a conductive state of one of the anti series connected field effect transistors will come into a saturated conductive state should a voltage transient occur on the conductor at a potential which could cause damage to the protected circuit, and in that the voltage sensing means is adapted to actuate the switch when the voltage drop across either anti series connected field effect transistor is so great that the anti series connected field effect transistor in question when conducting is in its saturated state.

2. The voltage shock protection circuit as claimed in claim 1, wherein the voltage sensing means includes a third field effect transistor, which has its drain electrode connected for sensing the voltage at the connection of the voltage shock protection circuit to the conductor or to the protected circuit and has its source electrode connected via the electronic switch to the source electrodes of the two anti series connected field effect transistors, and the gate electrode of the third field effect transistor being connected to the gate electrodes of the anti series connected field effect transistors for receiving the common drive voltage.

3. The voltage shock protection circuit as claimed in claim 2, wherein the electronic switch includes a thyristor having its anode connected to the gate electrodes of both anti series connected field effect transistors and its cathode connected to the source electrodes of both anti series connected field effect transistors, the source electrode of the third field effect transistor is connected to the gate electrode of the thyristor, the third field effect transistor being dimensioned, by coming into its saturated conductive state on the occurrence of a voltage transient, to be able automatically to limit the possible current to the gate electrode of the thyristor via the third field effect transistor to a magnitude which will not damage the thyristor or the protected circuit.

4. The voltage shock protection circuit as claimed in claim 3, wherein the drain electrode of the third field effect transistor is connected to the conductor via a diode biased for conducting current from the conductor to the third field effect transistor and blocking current in the opposite direction, the drain electrode of the third field effect transistor being connected to the protected circuit via a further diode adapted to conduct current in a direction from the protected circuit to the third field effect transistor and block current in the opposite direction.

5. The voltage shock protection circuit as claimed in claim 4, wherein the drive voltage means includes a Zener diode, one pole of which is connected to the source electrodes of both anti series connected field effect transistors, the other pole of the Zener diode being connected to the gate electrodes of the anti series connected field effect transistors, the drive voltage means including a first current generator means for supplying current to the pole of the Zener diode connected to the gate electrodes, the drive voltage means including a second current generator means for taking away a substantially equal current from the pole of the Zener diode connected to the source electrodes, said current being intended to pass through the Zener diode when the thyristor is not conductive, for achieving the common drive voltage for the field effect transistors, but to pass substantially through the thyristor instead when the thyristor is turned on, the current to/from the current generator means having a magnitude such that it exceeds the holding current of the thyristor.

6. The voltage shock protection circuit as claimed in claim 5, wherein the current generator means of the drive voltage means includes two current generators each connected to one of the poles of the Zener diode via separate diodes.

7. A voltage shock protection circuit adapted for connection between a conductor and a protected circuit for connecting the protected circuit to the conductor and protecting it against voltage transients of excessively high or low potential possibly occurring in the conductor where these could cause damage to the protected circuit, said voltage shock protection circuit including two reverse series connected field effect transistors and a drive voltage means controllable by an electronic switch, said reverse series connected field effect transistors having their source electrodes connected to each other and their gate electrodes connected to each other as well as having their substrates connected to the source electrode of the respective reverse series connected field effect transistor, said drive voltage means being controllable to a first operational state in which the drive voltage means strives to maintain a common drive voltage between the gate electrodes and source electrodes of the reverse series connected field effect transistors so that current can flow in both directions between the conductor and the protected circuit, as well as to a second operational state in which the drive voltage means strives to maintain a common drive voltage between the gate electrodes and source electrodes of the reverse series connected field effect transistors such that current cannot flow in any direction between the conductor and the protected circuit via both reverse series connected field effect transistors, said voltage shock protection circuit including a third field effect transistor, with its drain electrode connected for sensing the voltage at the connection of the voltage shock protection circuit to the conductor or to the protected circuit, the source electrode of this third field effect transistor being connected via the electronic switch to both the source electrodes of the two reverse series connected field effect transistors so that this third field effect transistor is sensitive to the voltage drops across both the reverse series connected field effect transistors, this third field effect transistor being adapted, when the voltage drop across either of the reverse series connected field effect transistors exceeds a given magnitude, to actuate the electronic switch for controlling the drive voltage means to the second operational state, characterized in that the gate electrode of the third field effect transistor is connected to the drive voltage means for receiving the common drive voltage, in that the electronic switch includes a thyristor, the anode of which is connected to the gate electrodes of the reverse series connected field effect transistors and the cathode of which is connected to the source electrodes of both reverse series connected field effect transistors, in that the source electrode of the third field effect transistor is connected to the gate electrode of the thyristor, and in that the third field effect transistor is dimensioned, by coming into its saturated state on the occurrence of a voltage transient, to be able automatically to limit the possible current to the thyristor gate electrode via the third field effect transistor to a magnitude which will not damage the thyristor or the protected circuit.

8. The voltage shock protection circuit as claimed in claim 7, wherein both reverse series connected field effect transistors are dimensioned such that in a conductive state one of them becomes saturated on the occurrence on the conductor of a voltage transient having a potential which could cause damage to the protected circuit, and in that the third field effect transistor is adapted to actuate the electronic switch when the voltage across either of the reverse series connected field effect transistors is so great that the reverse series connected field effect transistor in question is in its saturated state.

9. The voltage shock protection circuit as claimed in claim 8, wherein the gate electrode of the third field effect transistor is connected to the conductor via a diode biased for conducting current from the conductor to the third field effect transistor and blocking current in the opposite direction, the drain electrode of the third field effect transistor being connected to the protected circuit via a further diode adapted to conduct current in a direction from the protected circuit to the third field effect transistor and block current in the opposite direction.

10. The voltage shock protection circuit as claimed in claim 9, wherein the drive voltage means includes a Zener diode, one pole of which is connected to the source electrodes of both reverse series connected field effect transistors, the other pole of the Zener diode being connected to the gate electrodes of the reverse series connected field effect transistors, the drive voltage means including a first current generator means for supplying current to the pole of the Zener diode connected to the gate electrodes, the drive voltage means including a second current generator means for taking away a substantially equal current from the pole of the Zener diode connected to the source electrodes, said current being intended to pass through the Zener diode when the thyristor is not conductive, for achieving the common drive voltage for the field effect transistors, but to pass substantially through the thyristor instead when the thyristor is turned on, the current to/from the current generator means having a magnitude such that it exceeds the holding current of the thyristor.

11. The voltage shock protection circuit as claimed in claim 10, wherein the current generator means of the drive voltage means includes two current generators each connected one of the poles of the Zener diode via separate diodes.

12. A voltage shock protection circuit for connecting a protected circuit to a conductor and for protecting the protected circuit against voltage transients of excessively high or low potential possibly occurring on the conductor, which voltage transients could cause damage to the protected circuit, said voltage shock protection circuit comprising:

a first and a second field effect transistor having their source electrodes connected to each other and having their gate electrodes connected to each other, each field effect transistor having its substrate connected to its source electrode, the first field effect transistor having its drain electrode connected to the conductor, the second field effect transistor having its drain electrode connected to the protected circuit, the first and second field effect transistors being dimensioned such that in a conductive state one of them will come into a saturated conductive state should a voltage transient occur on the conductor having a potential which could cause damage to the protected circuit; drive voltage means for supplying drive voltage to the first and second field effect transistors, the drive voltage means having a first operational state in which the drive voltage means strives to maintain a common drive voltage between the gate electrodes and the source electrodes of the first and second transistors such that current can flow in both directions between the conductor and the protected circuit via the first and second transistors, the drive voltage means being controllable into a second operational state in which the drive voltage means strives to maintain a common drive voltage between the gate electrodes and the source electrodes of the first and second transistors such that current cannot flow in any direction between the conductor and the protected circuit via the first and second transistors voltage sensing means connected for sensing the voltage drops across the first and second transistors and for controlling the drive voltage means into the second operational state in dependence upon the voltage drops, the voltage sensing means controlling the drive voltage means into the second operational state when the voltage drop across either of the first and second transistors exceeds a predetermined magnitude so great that the transistor in question when conducting is in its saturated state.

13. A circuit as claimed in claim 12, wherein the voltage sensing means includes a third field effect transistor, the third field effect transistor having its drain electrode connected for sensing the voltage at the connection of the voltage shock protection circuit to the conductor or to the protected circuit, the third field effect transistor having its source electrode connected via the drive voltage means to the source electrodes of the first and second field effect transistors; and the gate electrode of the third field effect transistor being connected to the gate electrodes of the first and second transistors for receiving the common drive voltage.

14. A circuit as claimed in claim 13, wherein the drive voltage means includes a thyristor having its anode connected to the gate electrodes of the first and second field effect transistors, the thyristor having its cathode connected to the source electrodes of the first and second field effect transistors, the source electrode of the third field effect transistor being connected to the gate electrode of the thyristor; and the third transistor being dimensioned, by coming into its saturated conductive state on the occurrence of a voltage transient, to be able automatically to limit the possible current to the gate electrode of the thyristor via the third field effect transistor to a magnitude which will not damage the thyristor or the protected circuit.

15. A circuit as claimed in claim 14, wherein the drain electrode of the third field effect transistor is connected to the conductor via a diode biased for conducting current from the conductor to the third field effect transistor and blocking current in the opposite direction, the drain electrode of the third field effect transistor being connected to the protected circuit via a further diode adapted to conduct current in a direction from the protected circuit to the third field effect transistor and block current in the opposite direction.

16. A circuit as claimed in claim 15, wherein the drive voltage means includes a Zener diode one pole of which is connected to the source electrodes of the first and second field effect transistors, the other pole of the Zener diode being connected to the gate electrodes of the first and second field effect transistors, the drive voltage means including a first current generator means for supplying current to the pole of the Zener diode connected to the gate electrodes, the drive voltage means including a second current generator means for taking away a substantially equal current from the pole of the Zener diode connected to the source electrodes, said current being intended to pass through the Zener diode when the thyristor is not conductive, for achieving the common drive voltage for the first and second field effect transistors but to pass substantially through the thyristor instead when the thyristor is turned on; and the current to/from the current generator means having a magnitude such that it exceeds the holding current of the thyristor.

17. A circuit as claimed in claim 16, wherein the current generator means of the drive voltage means includes two current generators each connected to one of the poles of the Zener diode via separate diodes.

18. A voltage shock protection circuit for connecting a protected circuit to a conductor and for protecting the protected circuit against voltage transients of excessively high or low potential possibly occurring on the conductor, which voltage transients could cause damage to the protected circuit, said voltage shock protection circuit comprising:

a first and a second field effect transistor having their source electrodes connected to each other and having their gate electrodes connected to each other, each field effect transistor having its substrate connected to its source electrode, the first field effect transistor having its drain electrode connected to the conductor, the second field effect transistor having its drain electrode connected components to the protected circuit;

drive voltage means for supplying drive voltage to the first and second field effect transistors, the drive voltage means having a first operational state in which the drive voltage means strives to maintain a common drive voltage between the gate electrodes and the source electrodes of the first and second transistors such that current can flow in both directions between the conductor and the protected circuit via the first and second transistors, the drive voltage means having a second operational state in which the drive voltage means strives to maintain a common drive voltage between the gate electrodes and the source electrodes of the first and second transistors such that current cannot flow in any direction between the conductor and the protected circuit via both the first and second transistors, the drive voltage means comprising an electronic switch for controlling the drive voltage means into the second operational state;

voltage sensing means for sensing the voltage drops across the first and second transistors and for controlling the state of the drive voltage means in dependence upon the voltage drops, the voltage sensing means being connected to the electronic switch for controlling the drive voltage means into the second operational state when the voltage drop across either of the first and second transistors exceeds a predetermined value, the voltage sensing means including a third field effect transistor having its drain electrode connected for sensing the voltage at the drain electrode of the first or second transistor or at the connection of the protection circuit to the conductor or to the protected circuit, the source electrode of the third transistor being connected via the electronic switch to the source electrodes of the first and second transistors so that the third transistor is sensitive to the voltage drops across both the first and the second transistors, the gate electrode of the third transistor being connected to the drive voltage means for receiving drive voltage, the third transistor being dimensioned, by coming into its saturated state on the occurrence of a voltage transient, to be able automatically to limit the possible current to the electronic switch via the third field effect transistor to a magnitude which will not damage the electronic switch or the protected circuit.

19. A circuit as claimed in claim 18, wherein the first and second field effect transistors are dimensioned such that in a conductive state one of them becomes saturated on the occurrence on the conductor of a voltage transient having a potential which could cause damage to the protected circuit; and the third field effect transistor being adapted to actuate the switch when the voltage across either of the first and second transistors is so great that the transistor in question is in its saturated state.

20. A circuit as claimed in claim 19, wherein the drain electrode of the third field effect transistor is connected to the drain electrode of the first transistor or to the conductor via a diode vessel for conducting current from the conductor or first transistor to the third field effect transistor and blocking current in the opposite direction; and the drain electrode of the third field effect transistor being connected to the drain electrode of the second transistor or to the protected circuit via a further diode adapted to conduct current in a direction from the protected circuit or the second transistor to the third field effect transistor and block current in the opposite direction.

21. A circuit as claimed in claim 20, wherein the drive voltage means includes a thyristor and a Zener diode, one Zener diode is connected to the source electrodes of the first and second field effect transistors, the other pole of the Zener diode being connected to the gate electrodes of the first and second field effect transistors, the drive voltage means including a first current generator means for supplying current to the pole of the Zener diode connected to the gate electrodes, the drive voltage means including a second current generator means for taking away a substantially equal current from the pole of the Zener diode connected to the source electrodes of the first and second transistors, said current being intended to pass through the Zener diode when the thyristor is not conductive, for achieving the common drive voltage for the transistors but to pass substantially through the thyristor instead when the thyristor is turned on; and the current to/from the current generator means having a magnitude such that it exceeds the holding current of the thyristor.

22. A circuit as claimed in claim 21, wherein the current generator means of the drive voltage means includes two current generators each connected to one of the poles of the Zener diode via separate diodes.

23. A circuit as claimed in claim 18, wherein the electronic switch in the drive voltage means includes a thyristor, the anode of the thyristor being connected to the gate electrodes of the first and second transistors, the cathode of the thyristor being connected to the source electrodes of the first and second transistors; and the gate electrode of the thyristor being connected to the source electrode of the third transistor.

* * * * *